(12) United States Patent
Grady, IV et al.

(10) Patent No.: US 8,376,293 B2
(45) Date of Patent: Feb. 19, 2013

(54) SELF-SUPPORTING CANTILEVERED MOUNTING SYSTEM AND METHODS OF INSTALLATION THEREOF

(75) Inventors: William J. Grady, IV, Cary, NC (US); Jason E. Minyard, Phoenix, AZ (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 12/916,251

(22) Filed: Oct. 29, 2010

(65) Prior Publication Data

US 2012/0104200 A1    May 3, 2012

(51) Int. Cl.
*F16M 11/00* (2006.01)
(52) U.S. Cl. ...................................... 248/201; 248/309.1
(58) Field of Classification Search ............. 248/222.14, 248/224.8, 309.1, 201; 211/26, 192; 403/187, 403/201, 241, 247
See application file for complete search history.

(56) References Cited

U.S. PATENT DOCUMENTS

| | | | |
|---|---|---|---|
| 6,659,577 B2 | 12/2003 | Lauchner | |
| 6,856,514 B2 | 2/2005 | Smith | |
| 7,137,512 B2 | 11/2006 | Nguyen et al. | |
| 7,275,646 B2 * | 10/2007 | Mimlitch et al. | 211/26 |
| 7,281,694 B2 | 10/2007 | Allen et al. | |
| 7,357,362 B2 * | 4/2008 | Yang et al. | 248/221.11 |
| 7,703,734 B2 | 4/2010 | Chen et al. | |
| 8,025,166 B2 * | 9/2011 | Hilburn et al. | 211/192 |
| 8,146,756 B2 * | 4/2012 | Brock et al. | 211/192 |
| 2003/0160010 A1 * | 8/2003 | Robertson | 211/26 |
| 2008/0217274 A1 | 9/2008 | Curnalia et al. | |
| 2011/0240580 A1 * | 10/2011 | Yu et al. | 211/183 |

* cited by examiner

Primary Examiner — Ramon Ramirez
(74) Attorney, Agent, or Firm — Zilka-Kotab, PC

(57) ABSTRACT

A mounting system, in one embodiment, includes two support ears, each support ear adapted for securing an electronic component to a rack. Each support ear includes a planar portion which includes at least one hole for receiving one or more fasteners for coupling to a side of the electronic component and a portion extending perpendicular to the planar portion having a frontal area. The perpendicular portion includes at least one pin positioned on a side opposite the frontal area for engaging with at least one hole in the rack, the at least one pin extending normal to the perpendicular portion in a direction about parallel to a plane of the planar portion, and a first fastener positioned on the side opposite the frontal area for coupling to the rack, the first fastener extending normal to the perpendicular portion in the direction about parallel to the plane of the planar portion.

20 Claims, 14 Drawing Sheets

SELF-SUPPORTING CANTILEVERED MOUNTING SYSTEM AND METHODS OF INSTALLATION THEREOF

BACKGROUND

The present invention relates to rack mounting systems, and more particularly, to a rack mounting system for electronic equipment installation.

Many types of Information Technology (IT) rack-mounted equipment use a cantilevered style of mounting. In this conventional cantilevered style mount, an electronic component (e.g., router, server, switch, workstation, etc.) is supported by a left and a right mounting ear that are attached to a left and a right rack flange, such as on an Electronics Industry Alliance (EIA) IT equipment rack. In this common mounting configuration, the rear portion of the electronic component hangs freely without support of any kind. This is very different from a more traditional type of mounting where L-shaped brackets or slide rails extend from the front rack rails to the rear rack rails and provide a support shelf for the electronic component. The cantilever mount is often chosen over the L-bracket mount due to cheaper costs, and in many cases, the electronic component's weight does not justify or require the use of additional support in the IT rack.

BRIEF SUMMARY

In one embodiment, a mounting system includes two support ears, each support ear adapted for securing an electronic component to a rack and including a planar portion, wherein the planar portion comprises at least one hole for receiving one or more fasteners for coupling to a side of the electronic component and a portion extending perpendicular to the planar portion having a frontal area. The perpendicular portion includes at least one pin positioned on a side opposite the frontal area for engaging with at least one hole in the rack, the at least one pin extending normal to the perpendicular portion in a direction about parallel to a plane of the planar portion and a first fastener positioned on the side opposite the frontal area for coupling to the rack, the first fastener extending normal to the perpendicular portion in the direction about parallel to the plane of the planar portion.

In another embodiment, a mounting system includes two support ears, each support ear adapted for securing an electronic component to a rack, wherein each support ear includes a planar portion, wherein the planar portion comprises at least one hole for receiving one or more fasteners for coupling to a side of the electronic component, the at least one hole corresponding to at least one hole in the electronic component and a portion extending perpendicular to the planar portion having a frontal area. The perpendicular portion includes two shoulder pins positioned on a side opposite the frontal area for engaging with two holes in the rack, the shoulder pins extending normal to the perpendicular portion in a direction about parallel to a plane of the planar portion, and a thumbscrew having an adjusting portion accessible on the frontal area and an engaging portion on the side opposite the frontal area for coupling to the rack, wherein the thumbscrew is adapted for coupling to the rack without using a tool. Each shoulder pin includes a first portion having a first radial diameter and a second portion extending linearly from the first portion having a second radial diameter. The first portion is positioned closer to the perpendicular portion than the second portion, and the radial diameter of the first portion is larger than the radial diameter of the second portion, each support ear has an L-shaped profile, and the thumbscrew is positioned near a lower portion of the perpendicular portion, a first shoulder pin is positioned near a middle of the perpendicular portion, and a second shoulder pin is positioned near an upper portion of the perpendicular portion.

Other aspects and embodiments of the present invention will become apparent from the following detailed description, which, when taken in conjunction with the drawings, illustrates by way of example the principles of the invention.

DETAILED DESCRIPTION

Figure 1:
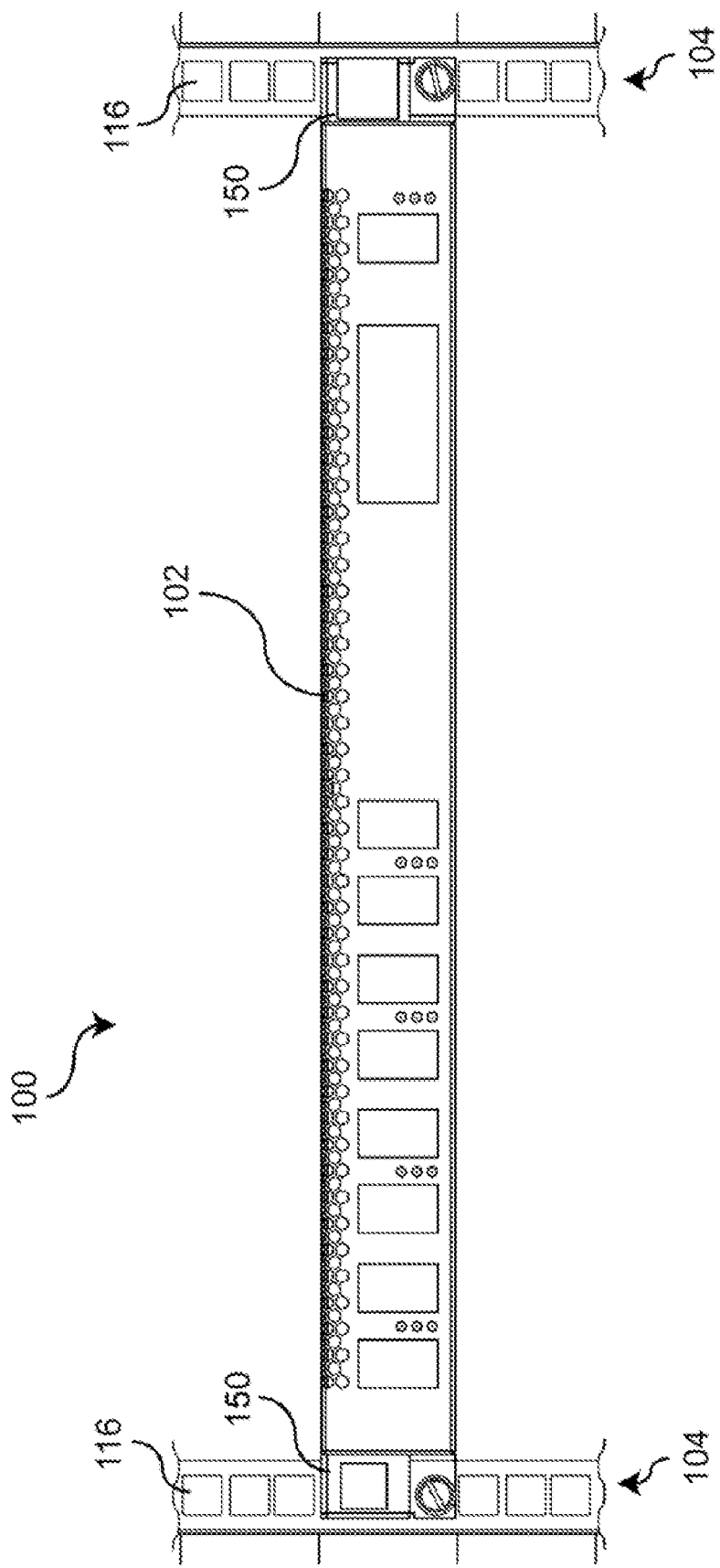
FIG. 1 is a schematic diagram of a mounting system according to one embodiment.
Figure 2A:
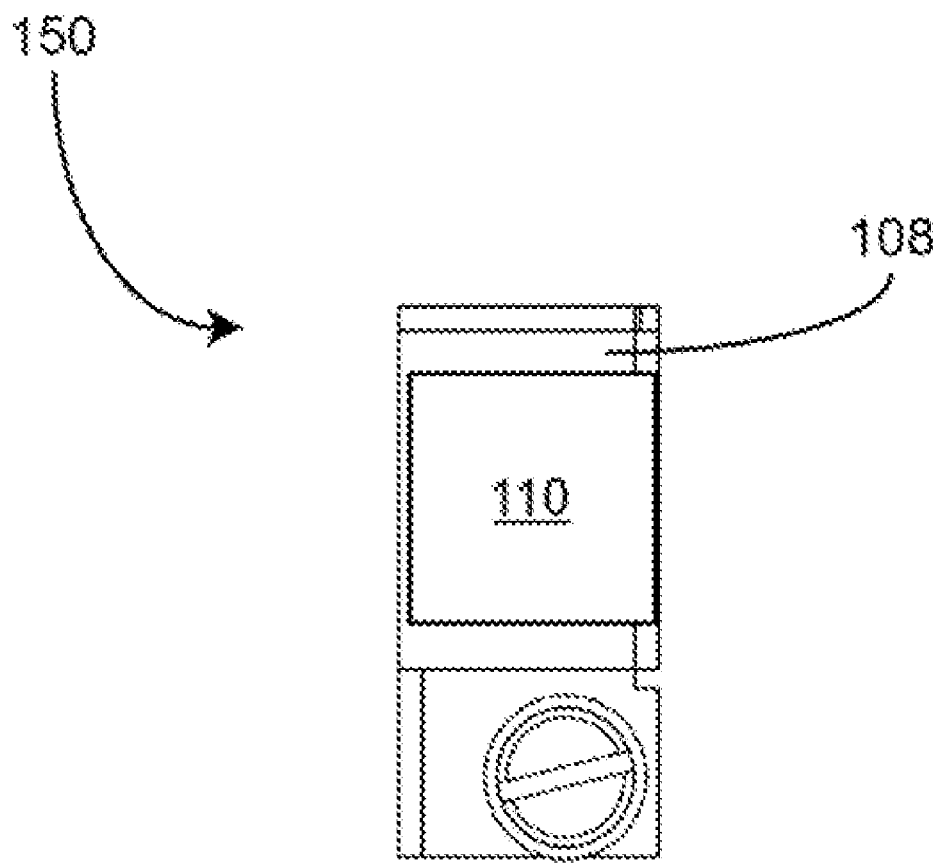
FIG. 2A is a schematic diagram of a front view of a right support ear of a mounting system, according to one embodiment.
Figure 2B:
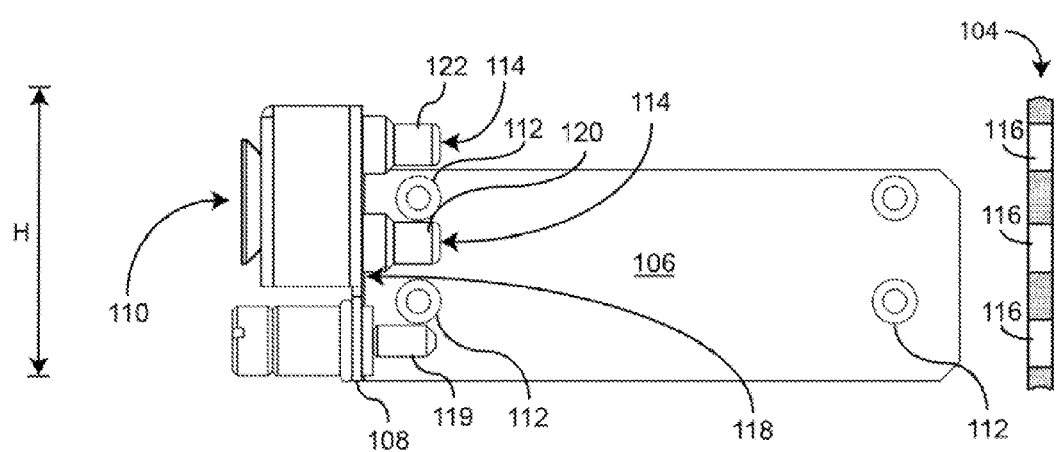
FIG. 2B is a schematic diagram of a side view of a right support ear of a mounting system, according to one embodiment.
Figure 2C:
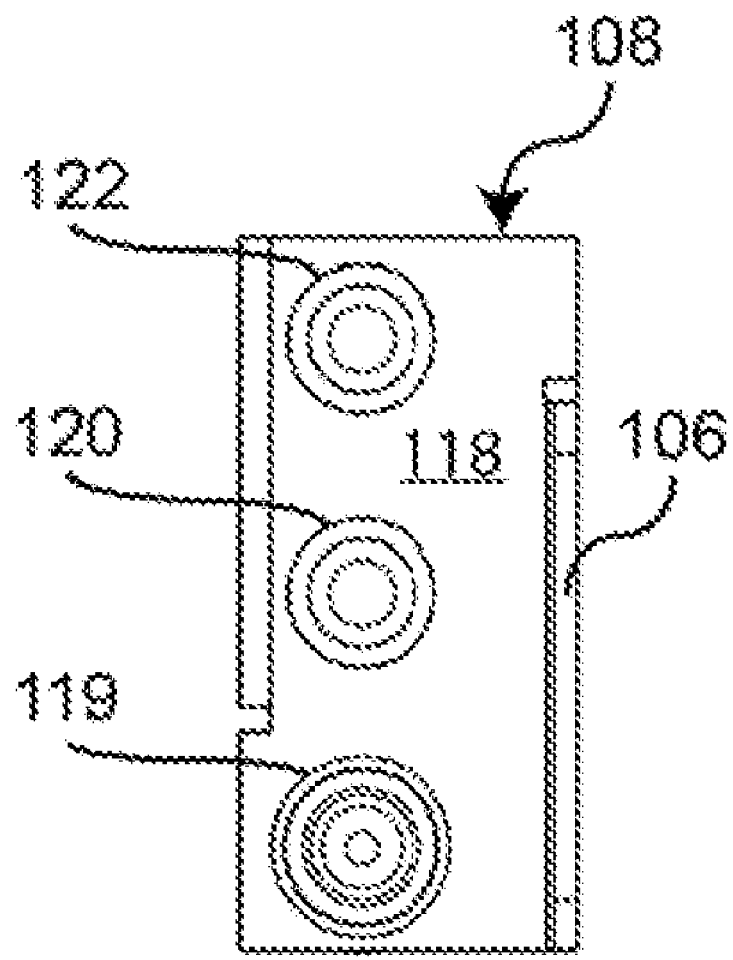
FIG. 2C is a schematic diagram of a rear view of a right support ear of a mounting system, according to one embodiment.
Figure 2D:
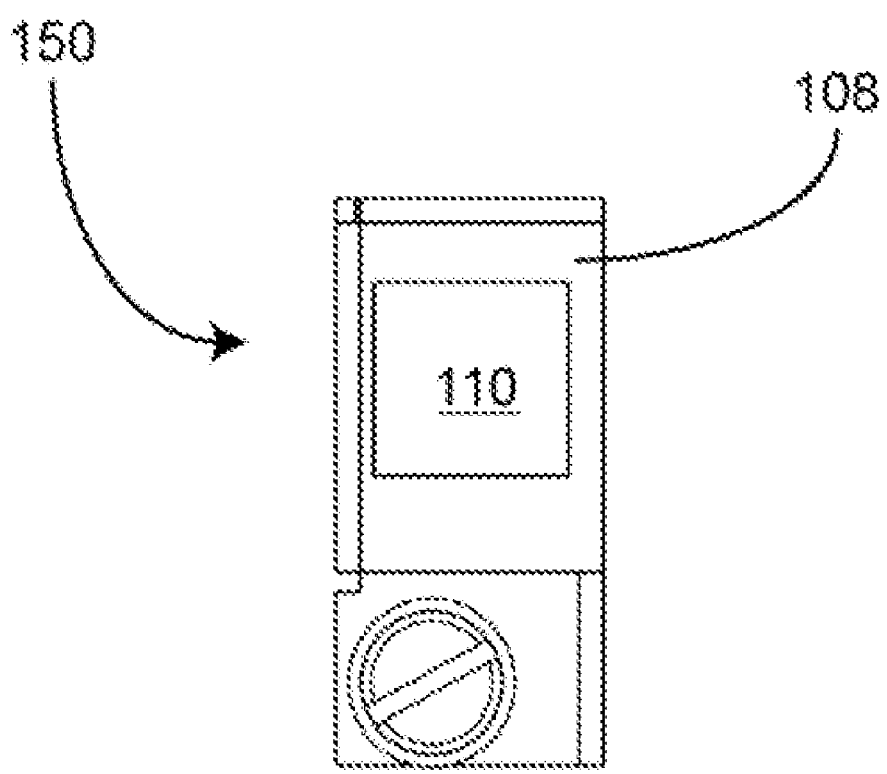
FIG. 2D is a schematic diagram of a front view of a left support ear of a mounting system, according to one embodiment.
Figure 2E:
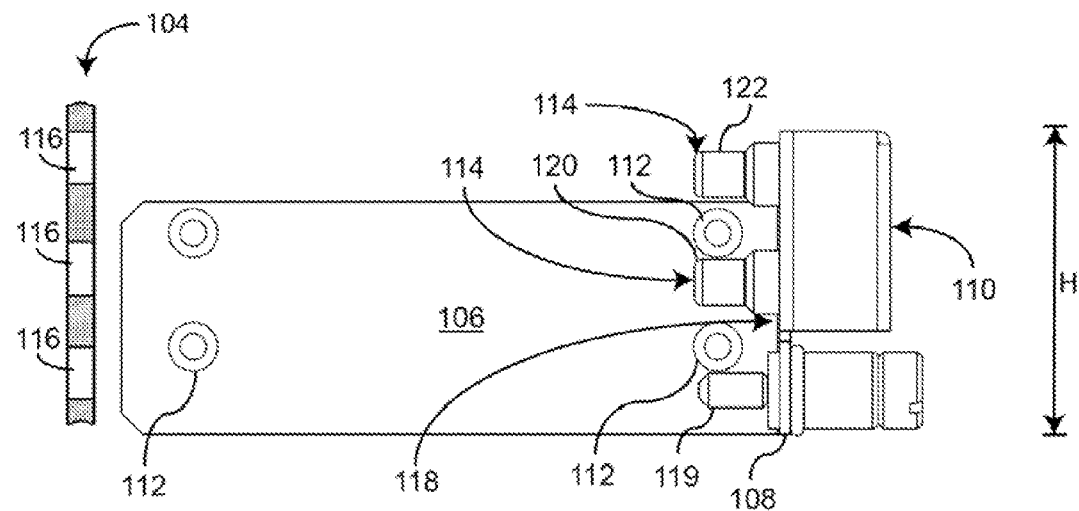
FIG. 2E is a schematic diagram of a side view of a left support ear of a mounting system, according to one embodiment.
Figure 2F:
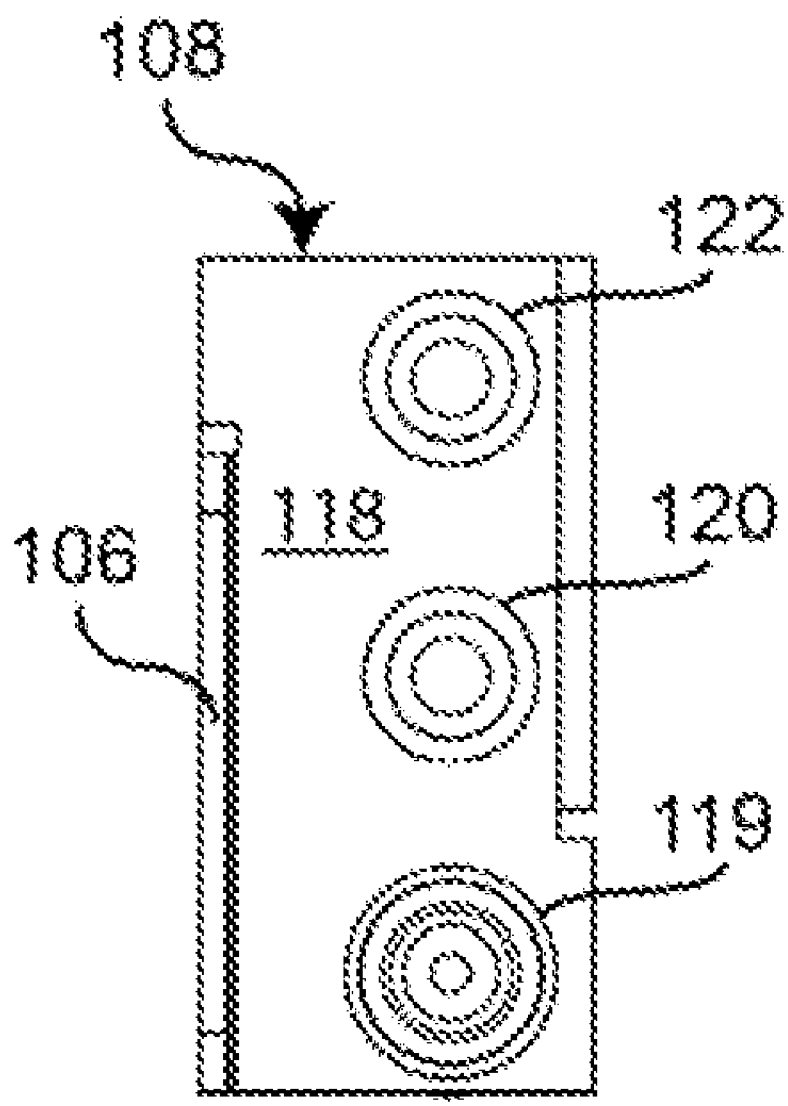
FIG. 2F is a schematic diagram of a rear view of a left support ear of a mounting system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description describes methods and systems for mounting electronic components into Information Technology (IT) or IT-like equipment racks, according to various embodiments.

According to one embodiment, a self-supporting rack mounting system and mounting method provide more rack ear front area and allow a single user/installer to mount electronic components into the rack, while avoiding the problems associated with cantilever style mounting as described below.

Some of the problems associated with conventional cantilevered style mounts when used with IT equipment racks involve installing the electronic component into the rack. The lack of support for the rear portion of the electronic component when being installed causes the user and/or installer to balance the entire weight of the electronic component while attempting to attach the rack ears of the mount to the rails of the IT equipment rack. Typically, a user/installer will use one hand with which to perform this task. Simultaneously, the user/installer must also position and attach four (4) screws through holes in the rack ears of the mount and into holes in the rails of the IT equipment rack, two (2) screws on each side of the electronic component. Typically, a user/installer will use the hand which is not holding/supporting the electronic component to perform this task by placing the screws through the rack ears and securing them to the rack rails with a screwdriver. These tasks are very difficult to perform simultaneously, especially with large and/or heavy electronic components, and often results in two users/installers installing the single electronic component into the rack ☐ one user/installer to hold the electronic component up and another user/installer to secure it to the rack.

In one general embodiment, a mounting system includes two support ears, each support ear adapted for securing an electronic component to a rack and including a planar portion, wherein the planar portion comprises at least one hole for receiving one or more fasteners for coupling to a side of the electronic component and a portion extending perpendicular to the planar portion having a frontal area. The perpendicular portion includes at least one pin positioned on a side opposite the frontal area for engaging with at least one hole in the rack, the at least one pin extending normal to the perpendicular portion in a direction about parallel to a plane of the planar portion and a first fastener positioned on the side opposite the frontal area for coupling to the rack, the first fastener extending normal to the perpendicular portion in the direction about parallel to the plane of the planar portion.

In another general embodiment, a mounting system includes two support ears, each support ear adapted for securing an electronic component to a rack, wherein each support ear includes a planar portion, wherein the planar portion comprises at least one hole for receiving one or more fasteners for coupling to a side of the electronic component, the at least one hole corresponding to at least one hole in the electronic component and a portion extending perpendicular to the planar portion having a frontal area. The perpendicular portion includes two shoulder pins positioned on a side opposite the frontal area for engaging with two holes in the rack, the shoulder pins extending normal to the perpendicular portion in a direction about parallel to a plane of the planar portion, and a thumbscrew having an adjusting portion accessible on the frontal area and an engaging portion on the side opposite the frontal area for coupling to the rack, wherein the thumbscrew is adapted for coupling to the rack without using a tool. Each shoulder pin includes a first portion having a first radial diameter and a second portion extending linearly from the first portion having a second radial diameter. The first portion is positioned closer to the perpendicular portion than the second portion, and the radial diameter of the first portion is larger than the radial diameter of the second portion, each support ear has an L-shaped profile, and the thumbscrew is positioned near a lower portion of the perpendicular portion, a first shoulder pin is positioned near a middle of the perpendicular portion, and a second shoulder pin is positioned near an upper portion of the perpendicular portion.

As shown in FIG. 1, according to one embodiment, a mounting system 100 includes two support ears 150, each support ear 150 adapted for securing an electronic component 102 to a rack 104, such as by using holes 116 in the rack 104.

Referring now to FIGS. 2A-2F, a front view, a side view, and a rear view of a right support ear 150, and a front view, a side view, and a rear view of a left support ear 150, respectively, are shown according to one approach. Each support ear 150 includes a planar portion 106 and a portion 108 extending perpendicular to the planar portion 106. The planar portion 106 includes at least one hole 112 for receiving one or more fasteners (not shown) for coupling to a side of the electronic component (102, FIG. 1).

The electronic component 102 may be of any type known in the art, such as a server, a switch, a router, a workstation, etc., according to some embodiments. Preferably, the electronic component 102 may be designed to fit into a standard IT equipment rack, such as an Electronics Industry Alliance (EIA) equipment rack in one embodiment. Additionally, the electronic component 102 may be designed to fit into a 1 u, 2 u, 3 u, etc., rack element volume, in some embodiments.

For example, according to one approach, dimensions of the two support ears 150 may correspond to a 1 u rack element of an Electronics Industry Alliance (EIA) equipment rack. Also, the rack 104 may be any rack known in the art, such as an EIA equipment rack, among others.

Referring again to FIGS. 2A-2F, the perpendicular portion 108 includes a frontal area 110 and at least one pin 114 positioned on a side 118 opposite the frontal area 110 for engaging with at least one hole 116 in the rack 104. The at least one pin 114 extends normal to the perpendicular portion 108 in a direction about parallel to a plane of the planar portion 106. The perpendicular portion 108 also includes a first fastener 119 positioned on the side 118 opposite the frontal area 110 for coupling to the rack 104, with the first fastener 119 extending normal to the perpendicular portion 108 in the direction about parallel to the plane of the planar portion 106.

Another problem with conventional cantilever style mounting is that the four mounting screws used to secure the electronic component into the rack take up a large amount of rack-ear frontal area. This rack-ear frontal area is very limited to begin with, and the placement of two screws or fasteners through holes in this frontal area only reduces this frontal area more. This is a concern, since the rack ear frontal area could be put to better use, such as for branding and/or labeling. For example, many electronic components use this rack ear frontal area for logo badges, serial number labels, and other items.

According to one embodiment, the frontal area 110 of each support ear 150 may include only a single fastener head. This frees up fontal area of the support ear 150 to be used for other purposes, such as displaying elements that do not fit on the primary bezel, such as branding, labels, light emitting diode (LED) indicators, etc. This is a great benefit when using electronic components where front-facing space is limited, and therefore this additional frontal area 110 may become quite valuable.

The first fastener 119 and all other fasteners described herein may be of any type known in the art, such as a screw, a thumbscrew, a brad, a clip, a friction fitting, etc.

In one approach, a height H of the support ear 150 may be about 1.75 inches, and a position of the at least one hole 112 in the planar portion 106 corresponds to at least one hole in the electronic component.

Figure 3A:
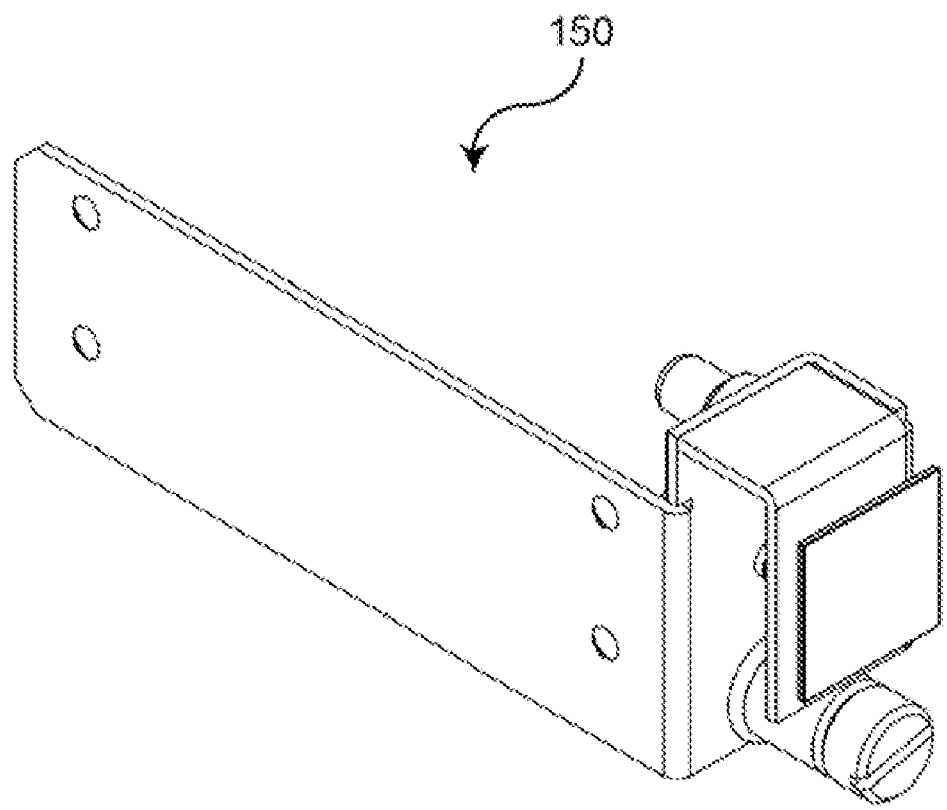
FIG. 3A is a front isometric diagram of a right support ear of a mounting system, according to one embodiment.
Figure 3B:
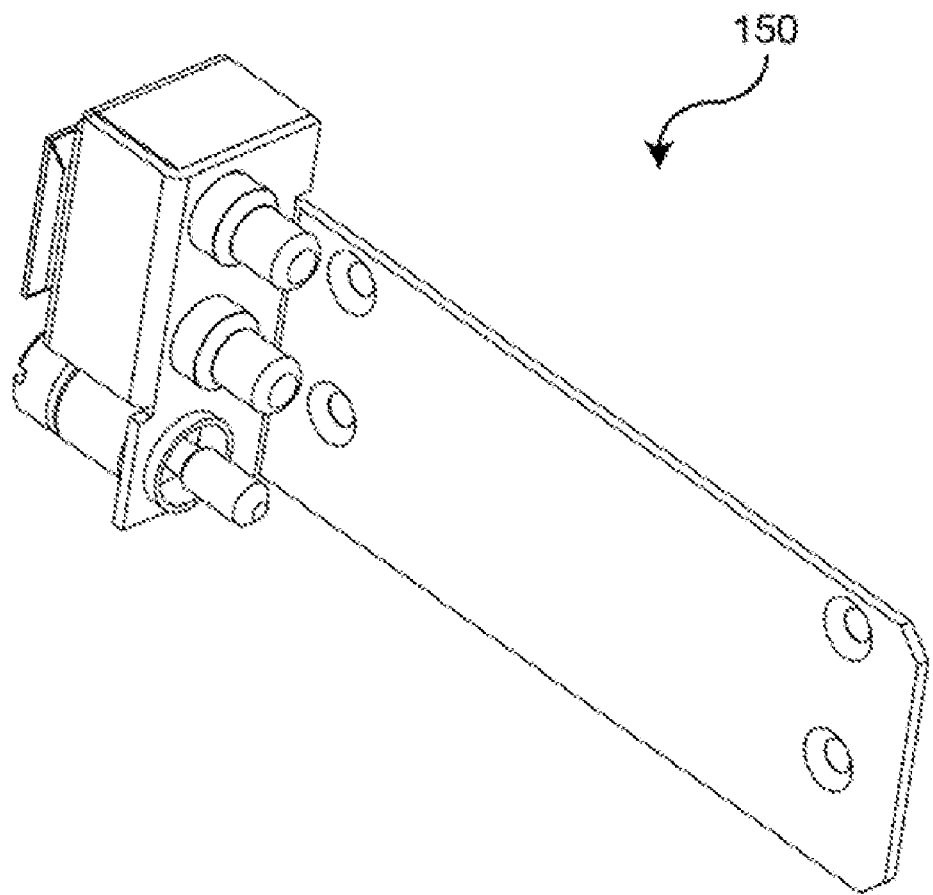
FIG. 3B is a rear isometric diagram of a right support ear of a mounting system, according to one embodiment.
Figure 3C:
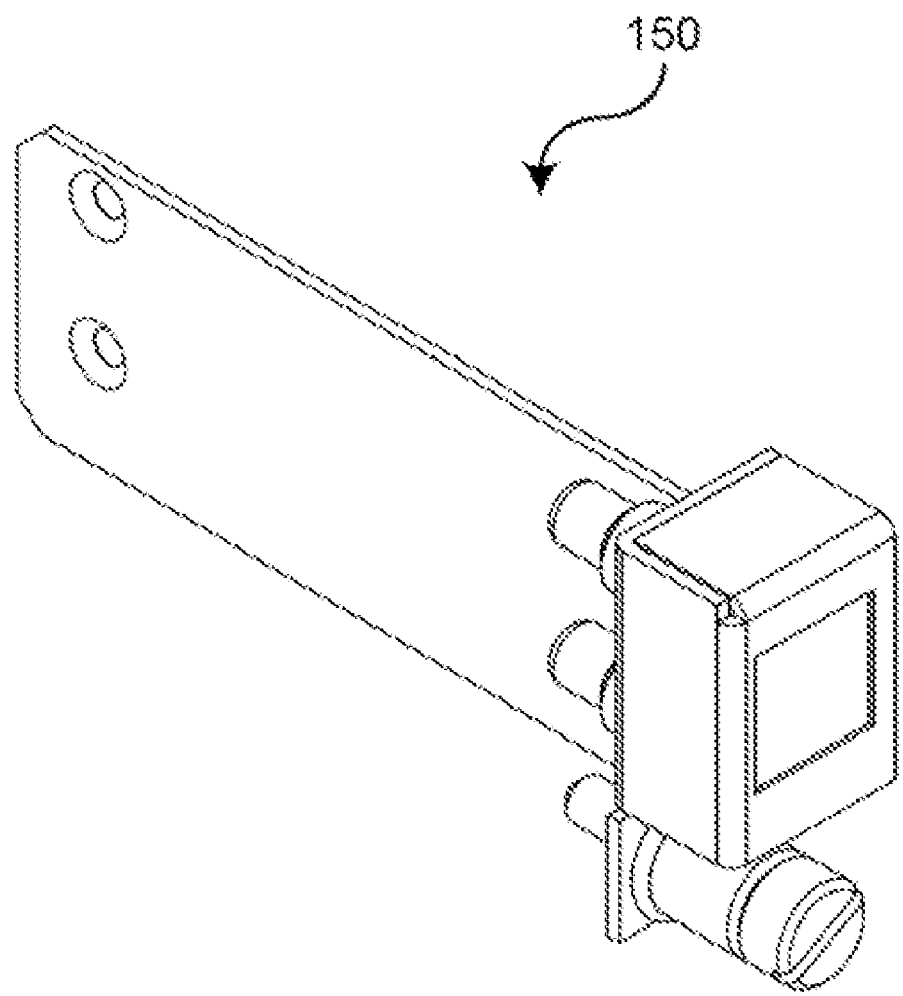
FIG. 3C is a front isometric diagram of a left support ear of a mounting system, according to one embodiment.
Figure 3D:
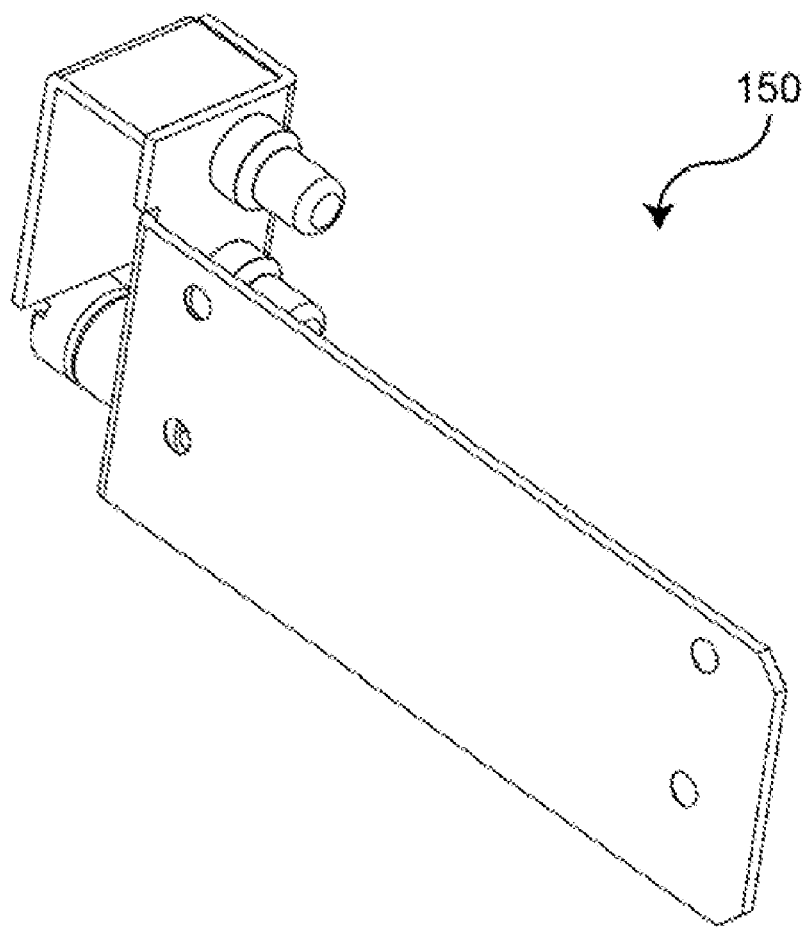
FIG. 3D is a rear isometric diagram of a left support ear of a mounting system, according to one embodiment.

In one embodiment, as shown in FIGS. 3A-3B, which are isometric views of a right support ear 150, and FIGS. 3C-3D, which are isometric views of a left support ear 150, each support ear 150 may have an L-shaped profile. Of course, each support ear 150 may have any shape which may allow it to mount to the electronic component and couple to the rack, according to various embodiments.

Referring again to FIGS. 2A-2F, in a preferred approach, the perpendicular portion 108 may include two pins 120, 122. In this or any other approach, the first fastener 119 may be positioned near a lower portion of the perpendicular portion 108, a first pin 120 may be positioned near a middle of the perpendicular portion 108, and a second pin 122 may be positioned near an upper portion of the perpendicular portion 108.

In another embodiment, the first fastener 119 may include a captive thumbscrew adapted for coupling to the rack 104 without using a tool. For example, the captured thumbscrews may allow the user/installer to press and turn the thumbscrew to secure the electronic component to the IT equipment rack without the use of any tools, and without a chance of losing the thumbscrew during installation.

In an initial test of a prototype mounting system, the time required to mount an electronic component was reduced by approximately 50% using embodiments described herein when compared to use of conventional cantilever style mounting systems.

Figure 4:
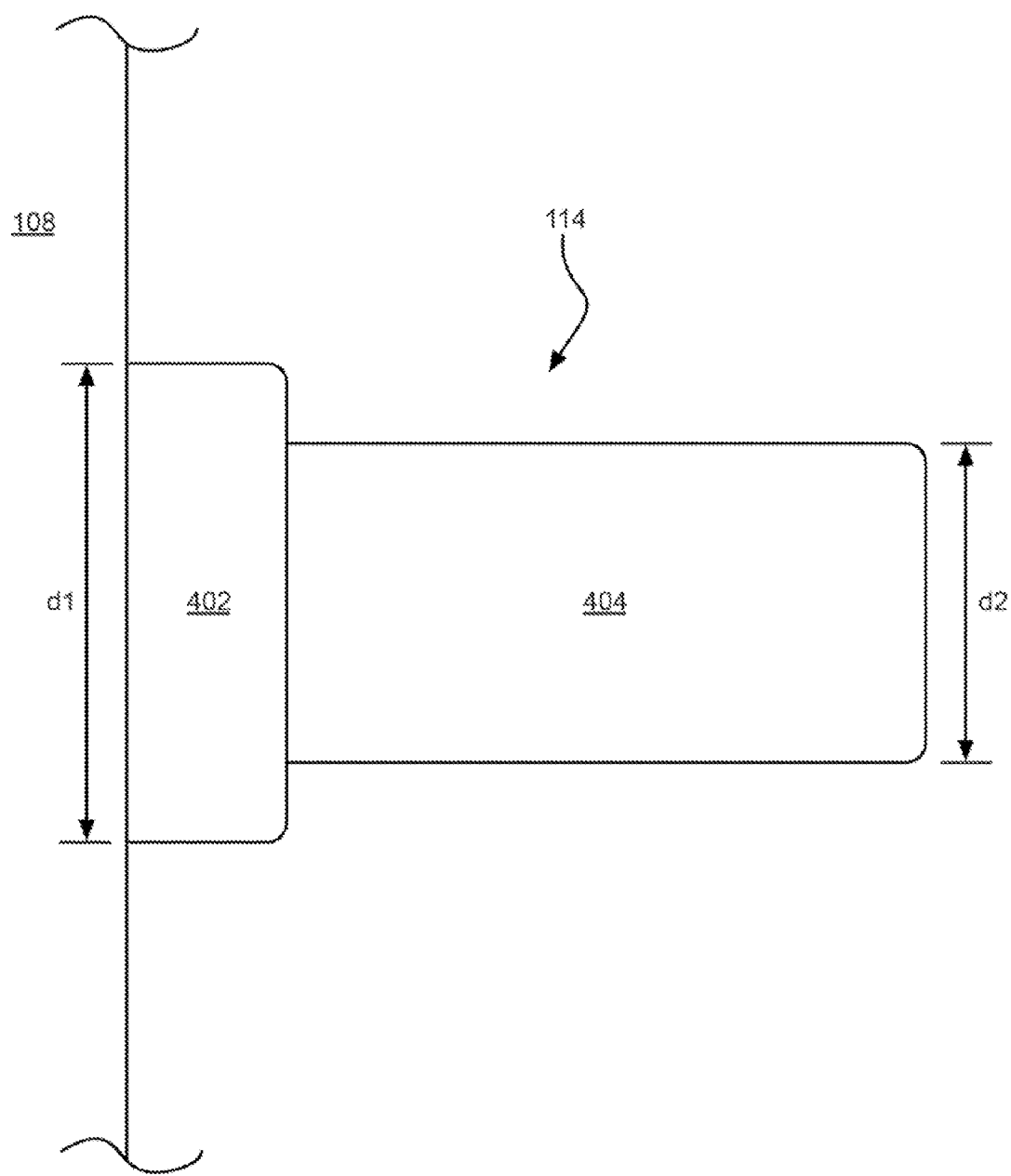
FIG. 4 shows a detailed view of a shoulder pin, according to one embodiment.

As shown in FIG. 4, in one embodiment, the at least one pin 114 may be a shoulder pin 114. Each shoulder pin 114 may include a first portion 402 having a first radial diameter d1, and a second portion 404 extending linearly from the first portion 402 and having a second radial diameter d2. The first portion 402 may be positioned closer to the perpendicular portion 108 than the second portion 404, the radial diameter d1 of the first portion 402 may be larger than the radial diameter d2 of the second portion 404, and the shoulder pin 114 may be adapted for securing the electronic component to the rack while the first fastener is coupled to the rack.

According to one approach, the radial diameter d1 of the first portion 402 may correspond to a smallest width of a square hole in the rack. In a further approach, the radial diameter d2 of the second portion 404 may correspond to an inner diameter of a round hole in the rack. In these approaches, the rack may be a standard rack of any kind, such as an EIA equipment rack, in one approach.

Figure 5:
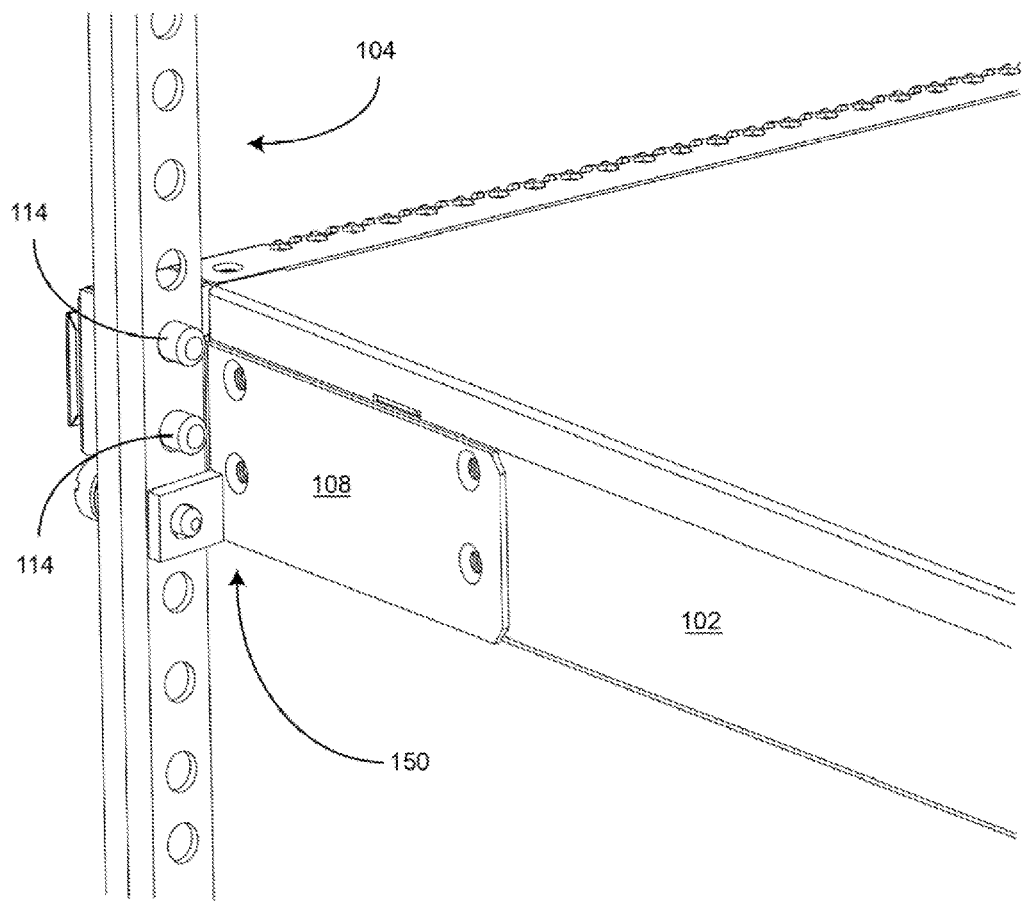
FIG. 5 is a schematic diagram of a rear side of a support ear of a mounting system installed in a rack, according to one embodiment.

Now referring to FIG. 5, for example, according to a preferred embodiment, a self-supporting cantilever rack ear 150 may use pins 114 to provide easy alignment and vertical support to users/installers during installation. Shoulder style pins (as shown in FIG. 4) may fit in both round-holed and square-holed IT racks 104, such as Electronics Industry Alliance (EIA) racks, and may allow an electronic component 102 to hang in the rack 104 with little user/installer effort to support the electronic component 102 during installation.

Figure 6:
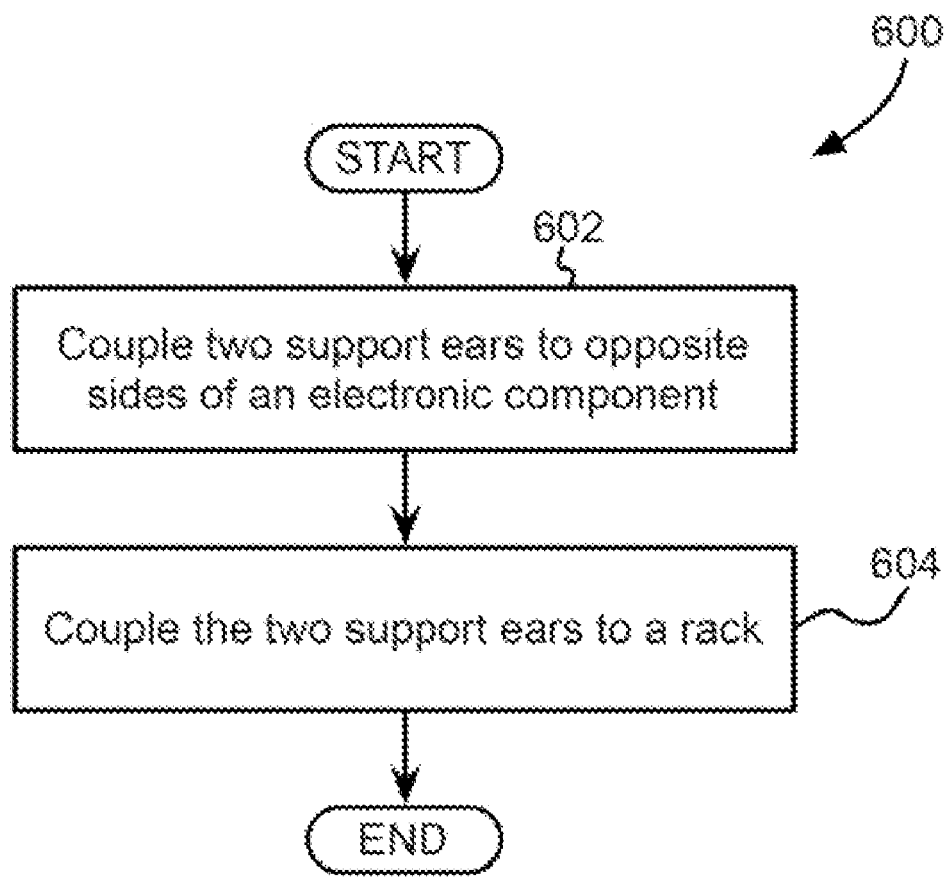
FIG. 6 is a flow diagram of a method for mounting an electronic component to a rack, according to one embodiment.

Now referring to FIG. 6, a method 600 is shown for mounting an electronic component to a rack, according to one embodiment. Of course, the method 600 may include more or fewer operations than those described below and shown in FIG. 6, as would be apparent to one of skill in the art upon reading the present descriptions. Also, the method 600 may be performed in any desired environment, and may involve systems, components, racks, and/or support ears as described in regard to FIGS. 1-5.

Referring again to FIG. 6, in operation 602, two support ears, such as those described herein, are coupled to opposite sides of an electronic component, such as those described herein. A right support ear and a left support ear, as shown in various figures herein, may be used to support opposite sides of an electronic component, in one approach.

In another approach, coupling the two support ears to opposite sides of the electronic component may include inserting at least one fastener through the at least one hole in the planar portion of each support ear and into at least one corresponding hole of the electronic component.

In operation 604, the two support ears are coupled to a rack.

According to one embodiment, coupling the two support ears to the rack may include inserting the at least one pin into at least one hole in the rack and coupling the first fastener to another hole in the rack.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A mounting system, comprising:
    two support ears, each support ear adapted for securing an electronic component to a rack, wherein each support ear comprises:
        a planar portion, wherein the planar portion comprises at least one hole for receiving one or more fasteners for coupling to a side of the electronic component; and
        a perpendicular portion extending perpendicular to the planar portion having a frontal area, wherein the perpendicular portion comprises:
            at least one pin positioned on a side opposite the frontal area for engaging with at least one hole in the rack, the at least one pin extending normal to the perpendicular portion in a direction about parallel to a plane of the planar portion, wherein the at least one pin is a shoulder pin, wherein the shoulder pin is adapted for securing the electronic component to the rack while the first fastener is coupled to the rack; and
            a first fastener positioned on the side opposite the frontal area for coupling to the rack, the first fastener extending normal to the perpendicular portion in the direction about parallel to the plane of the planar portion.

2. The mounting system as recited in claim 1, wherein each support ear has an L-shaped profile.

3. The mounting system as recited in claim 1, wherein the at least one shoulder pin comprises:
    a first portion having a first radial diameter; and
    a second portion extending linearly from the first portion having a second radial diameter,
    wherein the first portion is positioned closer to the perpendicular portion than the second portion, and
    wherein the radial diameter of the first portion is larger than the radial diameter of the second portion.

4. The mounting system as recited in claim 3, wherein the radial diameter of the first portion corresponds to a square hole in the rack.

5. The mounting system as recited in claim 3, wherein the radial diameter of the second portion corresponds to a round hole in the rack.

6. The mounting system as recited in claim 1, wherein the perpendicular portion comprises two pins.

7. The mounting system as recited in claim 1, wherein the first fastener comprises one of: a screw, a thumbscrew, a brad, and a clip.

8. The mounting system as recited in claim 1, wherein the first fastener comprises a captive thumbscrew adapted for coupling to the rack without using a tool.

9. The mounting system as recited in claim 1, wherein a height of the support ear is about 1.75 inches, and a position of the at least one hole in the planar portion corresponds to at least one hole in the electronic component.

10. The mounting system as recited in claim 1, wherein dimensions of the two support ears correspond to a 1 u rack element of an Electronics Industry Alliance (EIA) equipment rack.

11. The mounting system as recited in claim 1, wherein the first fastener is non-detachable from the perpendicular portion.

12. A mounting system as comprising:
   two support ears, each support ear adapted for securing an electronic component to a rack, wherein each support ear comprises:
      a planar portion, wherein the planar portion comprises at least one hole for receiving one or more fasteners for coupling to a side of the electronic component; and
      a portion extending perpendicular to the planar portion having a frontal area, wherein the perpendicular portion comprises:
         at least one pin positioned on a side opposite the frontal area for engaging with at least one hole in the rack, the at least one pin extending normal to the perpendicular portion in a direction about parallel to a plane of the planar portion; and
         a first fastener positioned on the side opposite the frontal area for coupling to the rack, the first fastener extending normal to the perpendicular portion in the direction about parallel to the plane of the planar portion,
      wherein the perpendicular portion comprises two pins,
      wherein the first fastener is positioned near a lower portion of the perpendicular portion, a first pin is positioned near a middle of the perpendicular portion, and a second pin is positioned near an upper portion of the perpendicular portion.

13. A method for mounting an electronic component to a rack, the method comprising:
   coupling two support ears of a mounting system to opposite sides of an electronic component; and
   coupling the two support ears to a rack, wherein coupling the two support ears to the rack comprises: inserting the at least one pin into at least one hole in the rack, and coupling the first fastener to another hole in the rack;
   wherein the mounting system includes:
      the two support ears, each support ear adapted for securing an electronic component to a rack, wherein each support ear comprises:
         a planar portion, wherein the planar portion comprises at least one hole for receiving one or more fasteners for coupling to a side of the electronic component; and
         a perpendicular portion extending perpendicular to the planar portion having a frontal area, wherein the perpendicular portion comprises:
            at least one pin positioned on a side opposite the frontal area for engaging with at least one hole in the rack, the at least one pin extending normal to the perpendicular portion in a direction about parallel to a plane of the planar portion; and
            a first fastener positioned on the side opposite the frontal area for coupling to the rack, the first fastener extending normal to the perpendicular portion in the direction about parallel to the plane of the planar portion.

14. The method as recited in claim 13, wherein coupling the two support ears to opposite sides of the electronic component comprises inserting at least one fastener through the at least one hole in the planar portion of each support ear and into at least one corresponding hole of the electronic component.

15. A mounting system, comprising:
   two support ears, each support ear adapted for securing an electronic component to a rack, wherein each support ear comprises:
      a planar portion, wherein the planar portion comprises at least one hole for receiving one or more fasteners for coupling to a side of the electronic component, the at least one hole corresponding to at least one hole in the electronic component; and
      a portion extending perpendicular to the planar portion having a frontal area, wherein the perpendicular portion comprises:
         two shoulder pins positioned on a side opposite the frontal area for engaging with two holes in the rack, the shoulder pins extending normal to the perpendicular portion in a direction about parallel to a plane of the planar portion, wherein each shoulder pin comprises:
            a first portion having a first radial diameter; and
            a second portion extending linearly from the first portion having a second radial diameter,
            wherein the first portion is positioned closer to the perpendicular portion than the second portion, and
            wherein the radial diameter of the first portion is larger than the radial diameter of the second portion; and
         a thumbscrew having an adjusting portion accessible on the frontal area and an engaging portion on the side opposite the frontal area for coupling to the rack, wherein the thumbscrew is adapted for coupling to the rack without using a tool,
      wherein each support ear has an L-shaped profile,
      wherein the thumbscrew is positioned near a lower portion of the perpendicular portion, a first shoulder pin is positioned near a middle of the perpendicular portion, and a second shoulder pin is positioned near an upper portion of the perpendicular portion.

16. The mounting system as recited in claim 15, wherein a height of the support ear is about 1.75 inches.

17. The mounting system as recited in claim 15, wherein dimensions of the two support ears correspond to a 1 u rack element of an Electronics Industry Alliance (EIA) equipment rack.

18. A method for mounting an electronic component to a rack, the method comprising:
   coupling the two support ears as recited in claim 15 to opposite sides of an electronic component; and
   coupling the two support ears to a rack.

19. The method as recited in claim 18, wherein coupling the two support ears to opposite sides of the electronic component comprises inserting at least one fastener through the at least one hole in the planar portion of each support ear and into at least one corresponding hole of the electronic component.

20. The method as recited in claim 18, wherein coupling the two support ears to the rack comprises:

inserting the at least one pin into at least one hole in the rack; and
coupling the first fastener to another hole in the rack.

* * * * *